(12) United States Patent
Wu et al.

(10) Patent No.: US 7,591,517 B2
(45) Date of Patent: Sep. 22, 2009

(54) MICRO-DROPLET INJECTION APPARATUS AND INJECTING PROCESS USING THE SAME

(75) Inventors: Kuo-Hua Wu, Hsinchu (TW); Chao-Kai Cheng, Hsinchu (TW); Chih-Jian Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 253 days.

(21) Appl. No.: 11/488,775

(22) Filed: Jul. 19, 2006

(65) Prior Publication Data

US 2007/0153033 A1 Jul. 5, 2007

(30) Foreign Application Priority Data

Dec. 29, 2005 (TW) .............................. 94147327 A

(51) Int. Cl.
*B41J 29/38* (2006.01)
(52) U.S. Cl. ..................... 347/5; 347/8; 347/17; 347/19
(58) Field of Classification Search .................. 356/510
See application file for complete search history.

(56) References Cited

U.S. PATENT DOCUMENTS

| | | | |
|---|---|---|---|
| 6,145,981 A | 11/2000 | Akahira et al. | |
| 6,582,048 B1 | 6/2003 | Akahira et al. | |
| 6,667,795 B2 | 12/2003 | Shigemura | |
| 2005/0001873 A1* | 1/2005 | Sugimura et al. | 347/29 |
| 2006/0093751 A1* | 5/2006 | White et al. | 427/466 |
| 2007/0008550 A1* | 1/2007 | Tobiason et al. | 356/510 |

FOREIGN PATENT DOCUMENTS

| | | |
|---|---|---|
| CN | 1403211 | 3/2003 |
| CN | 2592383 | 12/2003 |
| JP | 2005-246744 | 9/2005 |

* cited by examiner

*Primary Examiner*—Matthew Luu
*Assistant Examiner*—Justin Seo
(74) *Attorney, Agent, or Firm*—Harness, Dickey & Pierce, P.L.C.

(57) ABSTRACT

A micro-droplet injection apparatus and the injecting process using the same are provided for fabricating a micro-element. The apparatus includes an injection module, a moving stage module, an image detection module, and a temperature controlling module. The injection module is provided for injecting a micro-droplet on a substrate carried on the moving stage module, and the substrate is detected by the image detection module for detecting the relative position and inclined angle between the substrate and a injection head of the injection module. The temperature controlling module is provided for controlling the surface temperature of the substrate, such that the temperature of the substrate and the micro-droplets is balanced, and then the surface flatness of the film plated by micro-droplets is improved. The apparatus operates according to processing requirements of different substrates, achieving a stage multiplex function, and raising operation efficiency.

9 Claims, 12 Drawing Sheets

MICRO-DROPLET INJECTION APPARATUS AND INJECTING PROCESS USING THE SAME

CROSS-REFERENCE TO RELATED APPLICATIONS

This non-provisional application claims priority under 35 U.S.C. § 119(a) on Patent Application No(s). 094147327 filed in Taiwan, R.O.C. on Dec. 29, 2005, the entire contents of which are hereby incorporated by reference.

BACKGROUND OF THE INVENTION

1. Field of Invention

The present invention relates to an injection apparatus and an injecting process thereof, and more particularly, to a micro-droplet injection apparatus for coating a micro-element and the injecting process thereof.

2. Related Art

Drop-on-Demand Ink Jet Printing technology is a precise coating method with a high reproduction, which uses an injection head to perform micro-droplet injection on injection targets. It can be applied in the formation of conductive traces of various printed circuit board and circuit substrate. Usually, the injection head is moved back and forth in an X-axis direction, and the injection target is moved in a Y-axis direction, to inject micro-droplet on the injection target. Due to the widely application of micro-droplet injection, it plays a rather important role in the microminiaturization of the printed circuit board (PCB), color filter (CF), organic thin film transistor (OTFT), polymer lighting emission diode (PLED), bio-chip, and others.

A conventional micro-droplet injection platform is designed according to the requirements of micro-droplet injection, and includes a movable substrate stage, an injection head module, an injection head maintaining module, an image detection module, and a print control unit. However, the conventional micro-droplet injection platform often encounters the problems of jet orifices of injection head clogged and bubbles generated in the injection head, so that the problem of poor print cannot be solved effectively. Furthermore, when a maintain operation is carried out to the injection head module after finishing micro-droplet injection, it is not possible to observe the substrate image instantly or confirm the print quality instantly, causing a delay in the output time. If different micro-droplet injection processes are required, no proper manner can be provided to solve the problem occurring in the process for different substrates and micro-droplets to be injected.

U.S. Patent Publication No. U.S. Pat. No. 6,145,981 provides a method for detecting an injection effect instantly by a disable ink dot of the element to be printed when ink-injection can not reach the expectation.

U.S. Patent Publication No. U.S. Pat. No. 6,582,048 provides an injection head adjusting apparatus, which can enhance the precision of the alignment between the substrate and the injection head. It includes a position offset detection for detecting a relative position of the injection head, and an angle detection for detecting the inclined angle of the injection head, to achieve accurate alignment of the injection head and the substrate in the injection process.

U.S. Patent Publication No. U.S. Pat. No. 6,667,795 provides a micro-droplet injection apparatus with a color filter as an injection target, to achieve optimization of the injection with a space among the injection holes of the injection head.

In the former patents disclosed above, the multiplex requirement of micro-droplet injection apparatuses is not given complete consideration. In the process of injection, the precision of the alignment between the injection head and the moving stage is not sufficient, and the positioning system is not suitable. The processes for different micro-droplets and substrates cannot share one stage. The substrate yield is also seriously influenced by a poor solidification and flatness of the film plated by the micro-droplets. The injection head is not maintained thoroughly, and the operation preparation for the injection head is insufficient.

SUMMARY OF THE INVENTION

It is an objective of the present invention to provide a micro-droplet injection apparatus and an injecting process using the same for satisfying the multiplex requirement.

In order to achieve the above objects, a micro-droplet injection apparatus of the present invention is provided, which includes an injection module, a moving stage module, an image detection module, a temperature controlling module, and an injection head maintaining module. The injection head maintaining module is provided for cleaning the injection head and absorbing the residual liquid of the injection head, before the injection head goes into operation. The moving stage module is provided for carrying a substrate. The image detection module is provided for detecting a relative position and an inclined angle between the adjusted injection head and moving stage module for timely correction, and the temperature controlling module is disposed at the moving stage for regulating and controlling a surface temperature of the substrate.

According to a micro-droplet injection apparatus and the injecting process using the same disclosed by the present invention, an integrated multiplex stage architecture thereof can replace the former complicated process of screen printing, spin coating, and masking, thereby shortening the microelement process time, raising the operation efficiency. Also, the requirements for substrate detection and injection head maintaining and observation are all taken into consideration. With a design of heating, cooling, and heat insulation, temperatures are balanced, and the flatness of the film plated by the micro-droplets can be improved. According to process requirements of different substrates, the apparatus can also use various micro-droplets, to achieve uniformity of the stage usage function.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

A micro-droplet injection apparatus and the injecting process thereof according to the present invention can be used in a printed circuit board (PCB), but is not limited to being used in a PCB. The technology disclosed by the present invention can be applied in micro-elements fabricated by micro-droplet injection, such as the color filter (CF), organic thin film transistor (OTFT), polymer lighting emission diode (PLED), and bio-chip.

Figure 1:
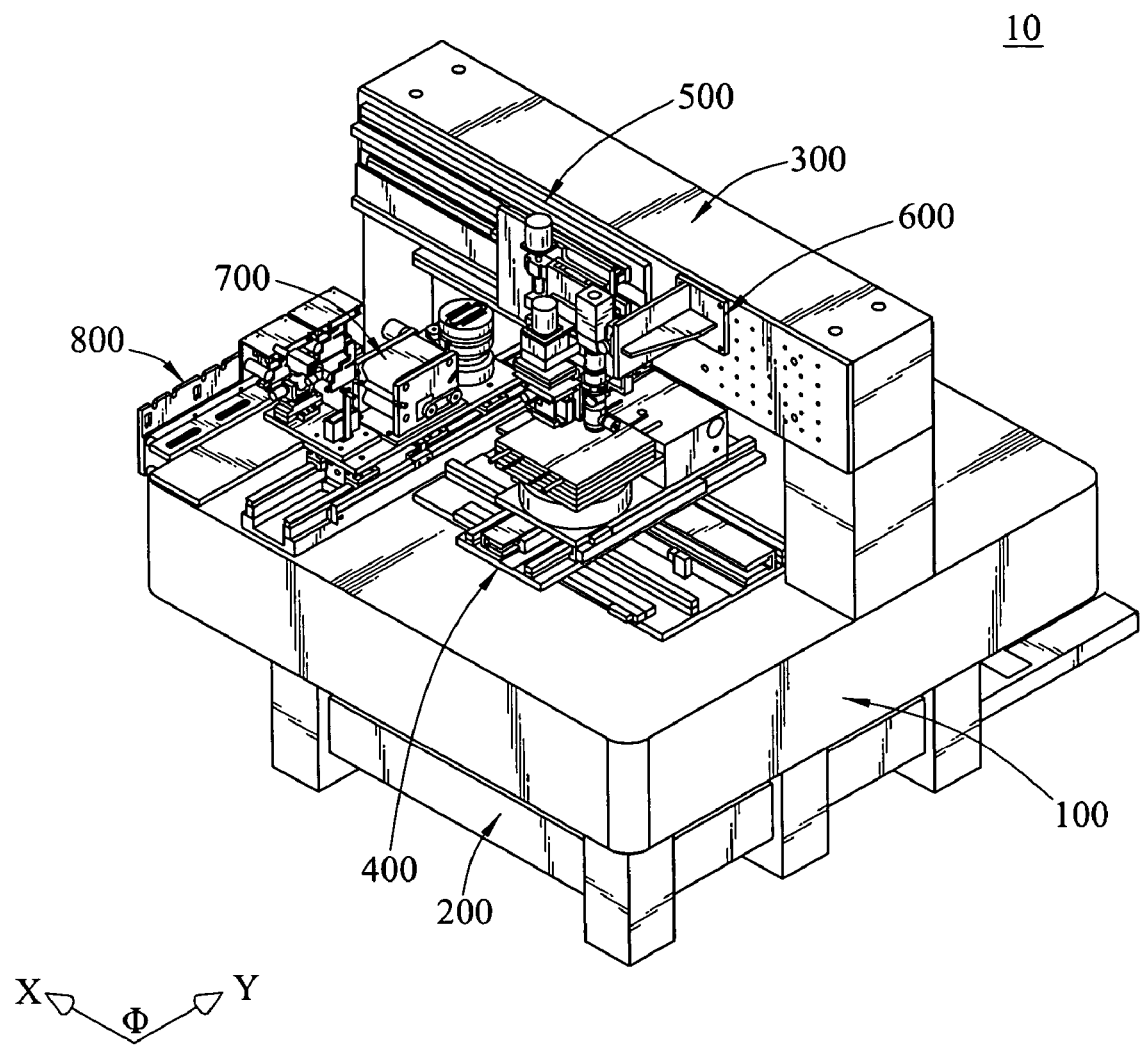
FIG. 1 is a schematic view according to an embodiment of the present invention.

Please refer to FIG. 1 of a schematic view of a micro-droplet injection apparatus 10 of the present invention. As shown in FIG. 1, the micro-droplet injection apparatus 10 includes a base 100, a carriage 200, a portal frame 300, a moving stage module 400, an injection module 500, an image detection module 600, an injection head maintaining module 700, and an injection head storage module 800.

Figure 2:
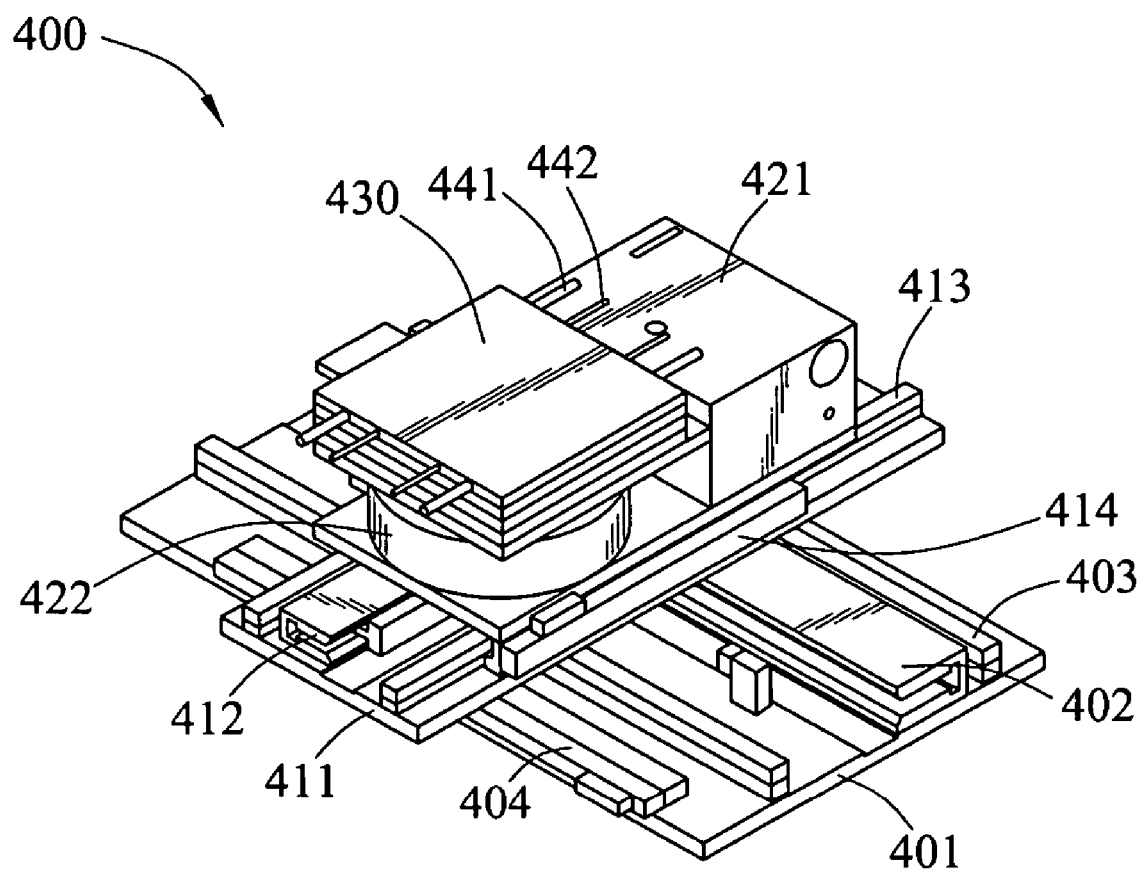
FIG. 2 is a schematic structural view of a moving stage module depicted in FIG. 1.

Please refer to FIG. 2 of the moving stage module 400 depicted in FIG. 1. The moving stage module 400 is provided for carrying a substrate to achieve an in-place injection while ensuring an injection precision. The moving stage module 400 includes an X-Y axis moving device for controlling the movement of the substrate. The X-Y axis moving device includes an X-axis base 401 for carrying an X-axis linear motor 402, an X-axis linear guide unit 403, and an X-axis linear encoder 404, to effect displacement of the stage module 430 in the X direction together. The X-axis linear encoder 404 is provided for controlling the required precision of the X-axis displacement. The X-Y axis moving device further includes a Y-axis base 411 for carrying a Y-axis linear motor 412, a Y-axis linear guide unit 413, and a Y-axis linear encoder 414, to effect displacement of the stage module 430 in the Y direction together. The Y-axis linear encoder 414 is provided for controlling the required precision of the Y-axis displacement. Furthermore, the moving stage module 400 includes a Φ rotating module 422, which is located on the X-Y axis moving device. For a Φ direction turning, the stepping motor module 421 switches the action onto the Φ rotating module 422, as an adjustment of a small angle. The stage module 430 is located on the Φ rotating module 422 for carrying the substrate. The moving stage module 400 is disposed with a heating element 441 and a thermocouple 442 for controlling the temperature, and carrying out heating, freezing, heat insulation, and cooling, according to the substrate process.

Figure 3:
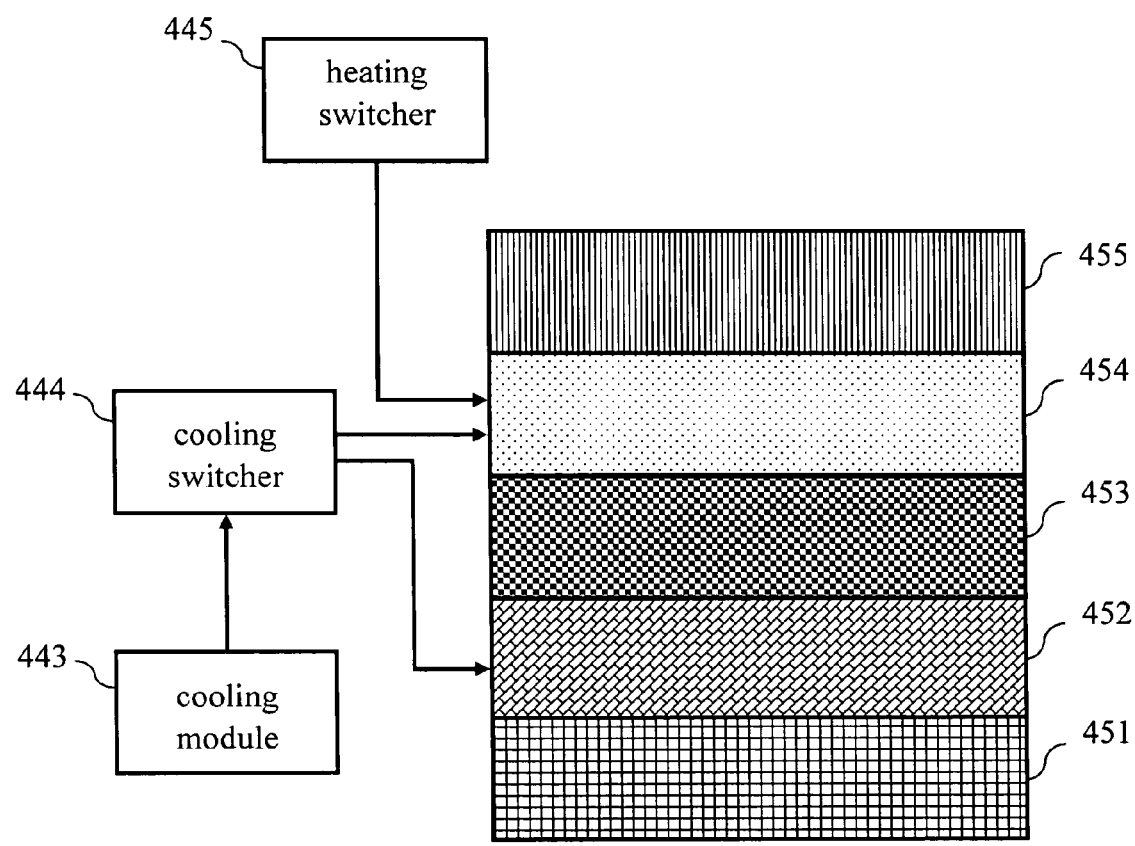
FIG. 3 is a schematic structural view of a temperature controlling module according to the embodiment of the present invention.

Please refer to FIG. 3 of a temperature controlling module 450 according to an embodiment of the present invention. The temperature controlling module 450 is disposed on the stage module 430 of the moving stage module 400, and composed of five layers sequentially. The temperature controlling module 450 includes a plate layer 451, a cooling layer 452 with one side contacted with the plate layer 451, a heat insulation layer 453 (formed by calcium silicate) with one side contacted with the other side of the cooling layer 452, a temperature controlling layer 454 with one side contacted with the other side of the heat insulation layer 453, and a clamping layer 455 (made of tool steel material, SKD11) contacted with the other side of the temperature controlling layer 454. The clamping layer 455 clamps the substrate by vacuum suction force, such that the substrate can be carried and fixed on the clamping layer 455. To maintain temperature control with a high precision, the temperature controlling layer 454 is combined with a heating element 441 and a cooling module 443. The heating element 441 can be an electric heating rod, an infrared ray source, or a ceramic heater, and can be composed of a plurality of sets of high-power and low-power heating elements. The heating element 441 is switched by a heating switcher 445 for heating the temperature controlling layer 454. The cooling module 443 is provided for cooling the temperature controlling layer 454. The cooling module 443 can be a water-cooling module, an air-cooling module, and a thermoelectric chip. Furthermore, the substrate temperature can be measured by a contact temperature measuring element. Therefore, when the moving stage module 400 is in a heating state, according to the temperature measuring result, the heating switcher 445 enables the heating element 441 for heating the temperature controlling layer 454 gradually, and at the same time, the cooling switcher 444 switches the cooling module 443 connected with the cooling layer 452 under the heat insulation layer 453, wherein the heat insulation layer 453 is used to prevent a heat transmission, to rise the temperature of the temperature controlling layer 454; and when the moving stage module 400 is in a cooling state, the heating switcher 445 disable the heating element 441 to stop heating for cooling down gradually, and at the same time, the cooling switcher 444 switches the cooling module 443 connected with the temperature controlling layer 454, for reducing the temperature.

Figure 4:
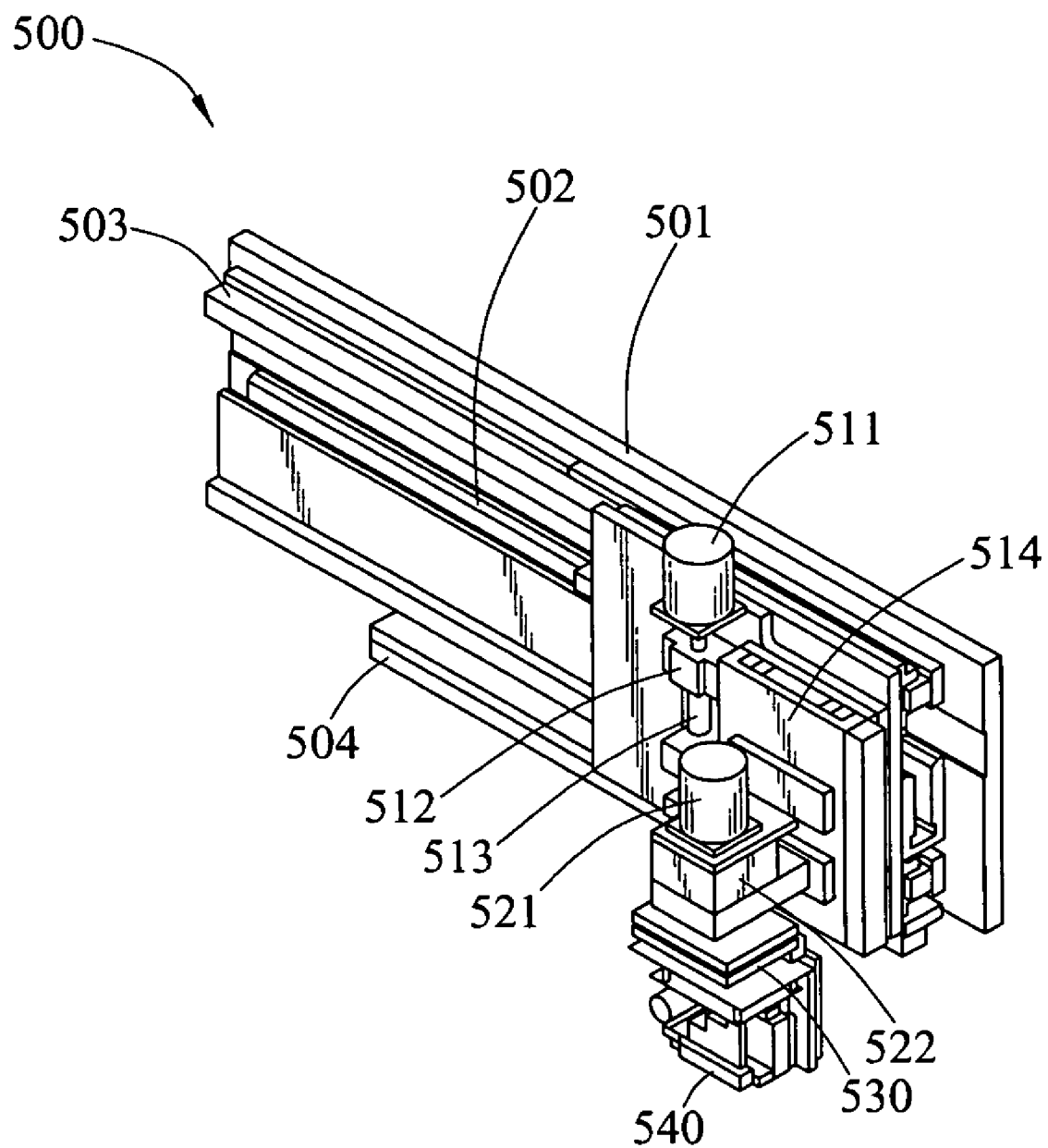
FIG. 4 is a schematic structural view of an injection module depicted in FIG. 1.
Figure 11:
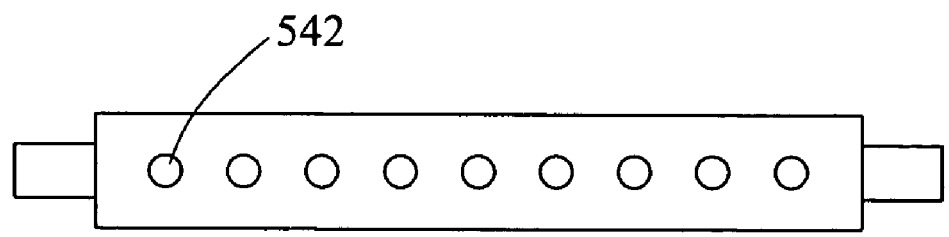
FIG. 11 is an arrangement view of the jet orifices according to the embodiment of the present invention.
Figure 12:
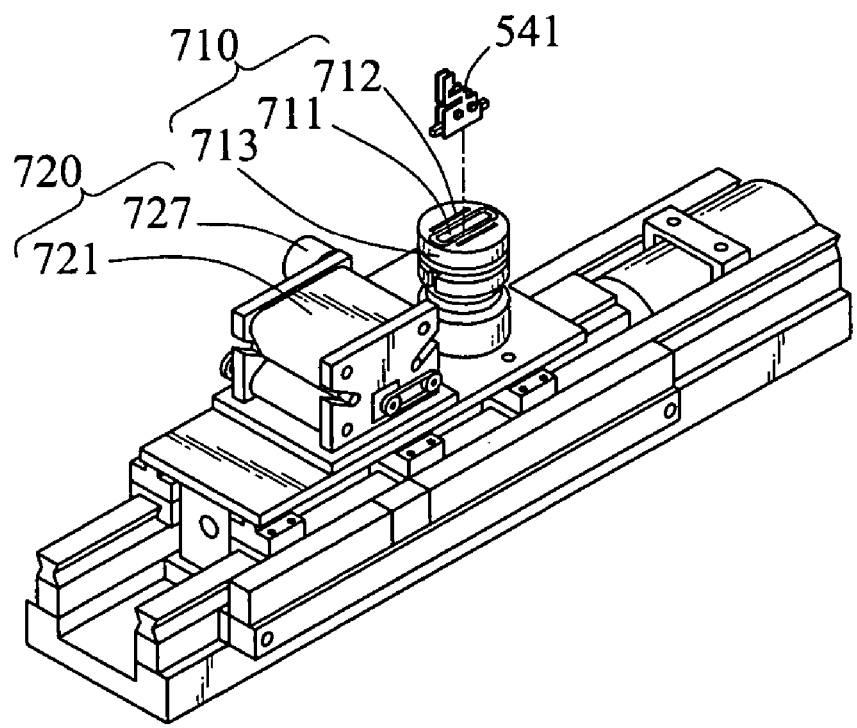
FIG. 12 is a schematic structural view showing a washing-humidification module and an absorbing module depicted in FIG. 6.

Please refer to FIG. 4 of the injection module 500 depicted in FIG. 1. The injection module 500 includes an X-axis base 501 for carrying an X-axis linear motor 502, an X-axis linear guide unit 503, and an X-axis linear encoder 504, to achieve a displacement of the injection head module 540 in the X direction. The X-axis linear encoder 504 is provided for controlling the required precision of the X-axis displacement. The injection module 500 further includes a Z-axis stepping motor 511 for adjusting a distance between the injection head module 540 and the substrate. The Z-axis stepping motor 511 carries out a displacement of the injection head module 540 in the Z direction by a bearing support 512, a ball screw 513, and an adjusting base 514. The Z-axis linear encoder 515 can be used to control the required precision of the Z-axis displacement. The injection head module 540 comprises an injection head 541 (as shown in FIG. 12) and a plurality of jet orifices 542 (as shown in FIG. 11). Angular rotation of the injection head 541 is achieved by a stepping motor module 521 and a harmonic driver 522. To ensure a parallelism and an appropriate distance between the injection head 541 and the substrate, an attitude adjusting module 530 is disposed on the injection head 541. The attitude adjusting module 530 includes a laser displacement gauge for detecting a parallelism and distance between the injection head 541 and the substrate in an optical imaging manner, for adjusting a parallelism and distance between the injection head 541 and the substrate to achieve more precise injection.

Figure 5:
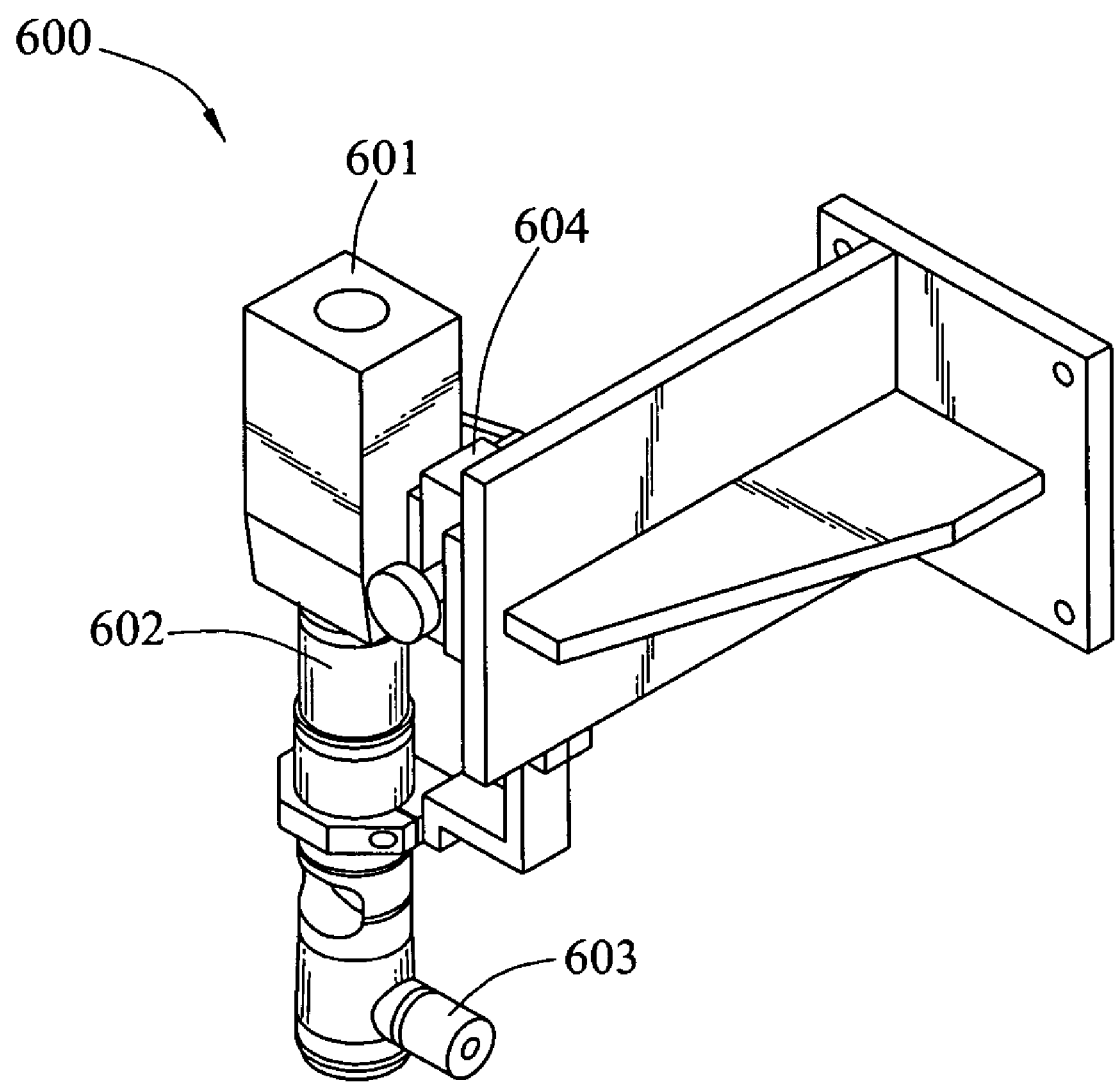
FIG. 5 is a schematic structural view of an image detection module depicted in FIG. 1.
Figure 6:
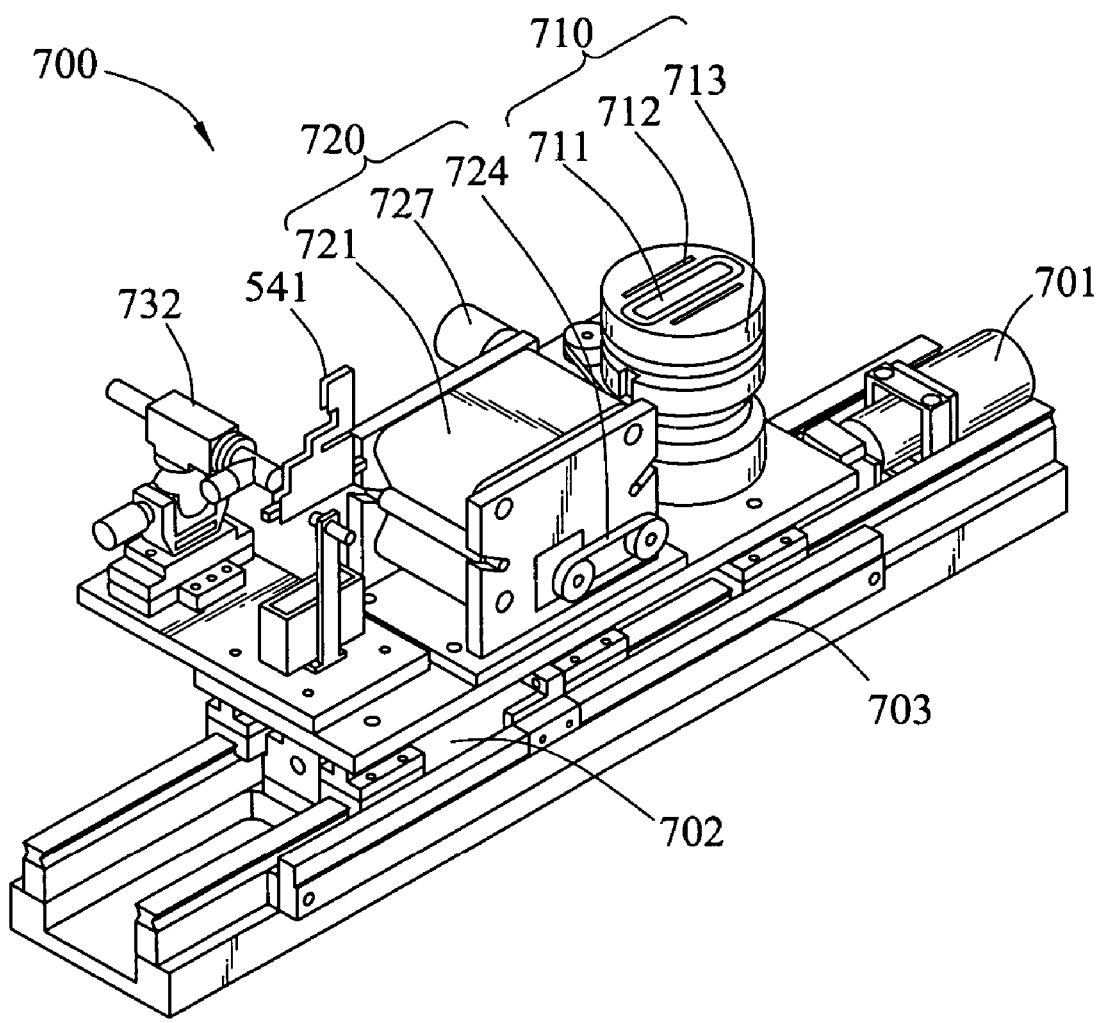
FIG. 6 is a schematic structural view of an injection head maintaining module depicted in FIG. 1.

Please refer to FIG. 5 of the image detection module 600 depicted in FIG. 1. The image detection module 600 is for detecting a relative position between the injection head 541 and the substrate before injecting, and an instant image detection in the injecting process for detecting the injection state of the injection module 500. The injection state means whether or not a given area of the substrate has not been injected and whether or not the jet orifices of the injection head are obstructed by micro-droplets. It can be achieved by using an image detection device 601, a lens 602 corresponding to the image detection device 601, and a light source module 603. The image sharpness of the injection dot can be adjusted by the adjusting base 604. The image detection device can be a charge coupled device (CCD) or complementary metal-oxide semiconductor (CMOS) sensing element.

Please refer to FIGS. 6, 9, 10, 11, and 12 of the injection head maintaining module 700. The injection head maintaining module 700 is provided for maintaining and cleaning the injection head module 540. The injection head maintaining module 700 includes a stepping motor 701, a Y-axis linear encoder 703, a washing-humidification module 710, an absorbing module 720, and a stroboscope 732. The stepping motor 701 is used for driving the injection head maintaining module 700 to move in a Y-axis direction, and the Y-axis linear encoder 703 is used for carrying out a further accurate position. The washing-humidification module 710 includes a washing tank 711, a cap 712, and a washing-humidification body 713. The absorbing module 720 includes a porous body 721, a supporter 722, a moving module 723, a belt pulley 724 for driving the moving module 723, a rotation encoder 727, a fastening knob 728, and a pushing unit 729. The injection head maintaining module 700 is disposed with a stroboscope 732, for observing the state of the micro-droplets injected by the injection head 541.

The washing tank 711 and the cap 712 in the washing-humidification module 710 are disposed on the washing-humidification body 713, as shown in FIG. 12. The shape of the cap 712 corresponds to the shape of the injection head 541. Both the washing tank 711 and the cap 712 are parallel with the orientation of the jet orifice 542 of the injection head 541. The washing tank 711 is filled with a solvent for cleaning the jet orifice 542 of the injection head 541. The solvent can be a liquid the same as the micro-droplet, and also can be a liquid having principle ingredient the same as that of the micro-droplet. When some micro-droplets remain in the injection head 541, the injection head 541 can be placed into the washing tank 711 for cleaning. The cap 712 is used for covering the injection head 541, such that the injection head 541 is in a saturated vapor environment for ensuring the wetness of the injection head 541, which is beneficial for an operation preparation of the injection head 541. A vacuum pump can be disposed at the cap 712, for producing a vacuum suction force to suck out the clog when the injection head 541 is clogged by residual micro-droplets, such that the injection head 541 can resume a normal action. Furthermore, the jet orifices 542 of the injection head 541 are arranged in a straight line as shown in FIG. 11, and therefore, the washing tank 711 and the cap 712 are made parallel with the orientation of the jet orifices 542.

Figure 9:
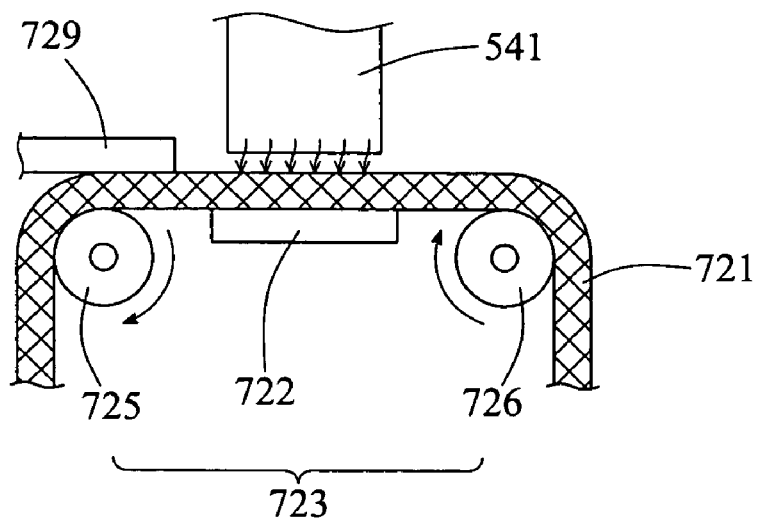
FIG. 9 is a schematic view of an operating principle of an absorbing module of the injection head maintaining module depicted in FIG. 6.
Figure 10:
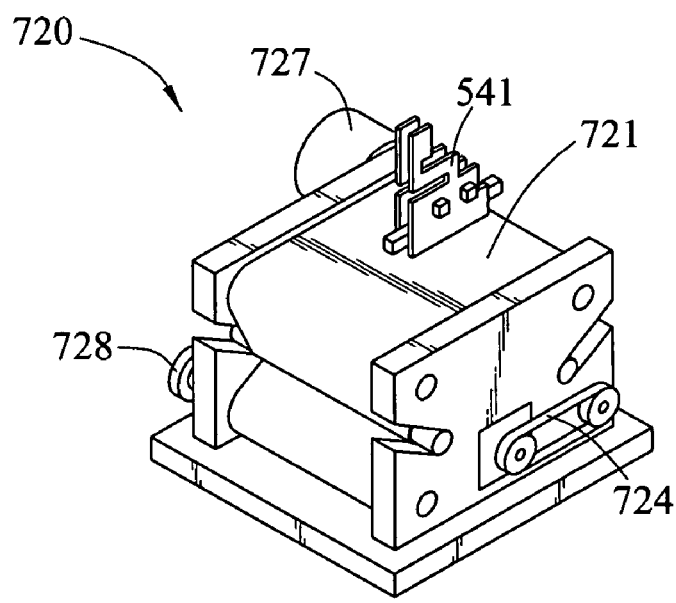
FIG. 10 is a schematic structural view of an absorbing module of the injection head maintaining module depicted in FIG. 6.

After the injection head 541 is washed or pumped by the cap 712, an absorbing module 720 is required to dry the injection head 541, and remove any micro-droplets or solvent remaining on the injection head 541. Therefore, the absorbing module 720 is disposed near the absorbing module 710. The porous body 721 of the absorbing module 720 is contacted with the injection head 541. The porous body 721 is of a band shape and is scrolled similarly to a magnetic tape of a recording cassette. The porous body 721 can be a porous material or a polymeric material, for absorbing the micro-droplet or solvent remaining on the injection head 541, as shown in FIG. 10. The moving module 723 has a first roller 725 and a second roller 726 for moving the porous body 721. As the porous body 721 is of a band shape, it is wound around the first roller 725 and the second roller 726. The scrolling is achieved by that, a controller controls the motor to pass a motive force to the first roller 725 via the belt pulley 724, and the second roller 726 is driven to rotate by the banded porous body 721, such that the porous body 721 is moved by the scrolling of the first roller 725 and the second roller 726. The dry part of the porous body 721 which does not absorb can contact the injection head 541 continuously, maintaining an absorption function (as shown in FIG. 9). Furthermore, a rotation encoder 727 can be used to calculate the length of the used porous body 721, to determine whether to change the porous body 721 or not. When it is to change the porous body 721, the porous body 721 can be taken out for changing by simply loosening the fastening knobs 728 at the front and rear terminals of the porous body 721. The material of the porous body 721 can be a porous material or a polymeric material. The porous body 721 contains many micro flow channels, and the capillary force makes the micro-droplets flow out by drainage. The saturated vapor pressure on the surface of the jet orifices 542 is added, reducing the volatility of the jet orifices 542. Also, a micro pressure difference caused by the capillary force causes a creep flow to the jet orifices 542, to conduct the micro particles out, such that injection head 541 is provided with a priming function.

The absorbing module 720 can be disposed with a supporter 722 and a pushing unit 729. One side of the porous body 721 is contacted with the pushing unit 729 which can provide a pressing force at one side of the porous body 721, to maintain a certain tension force in the porous body 721. The supporter 722 can be a porous material, and the other side of the porous body 721 is contacted with the supporter. When the injection head 541 contacts the porous body 721, the supporter 722 provides a supporting force to the porous body 721. When the injection head 541 is lower down, the porous body 721 is contacted with the injection head 541 more tightly. The drainage is quickened by the pressure difference caused by contact, such that the residual micro-droplets and solvent are cleared away by the porous body 721.

Figure 7:
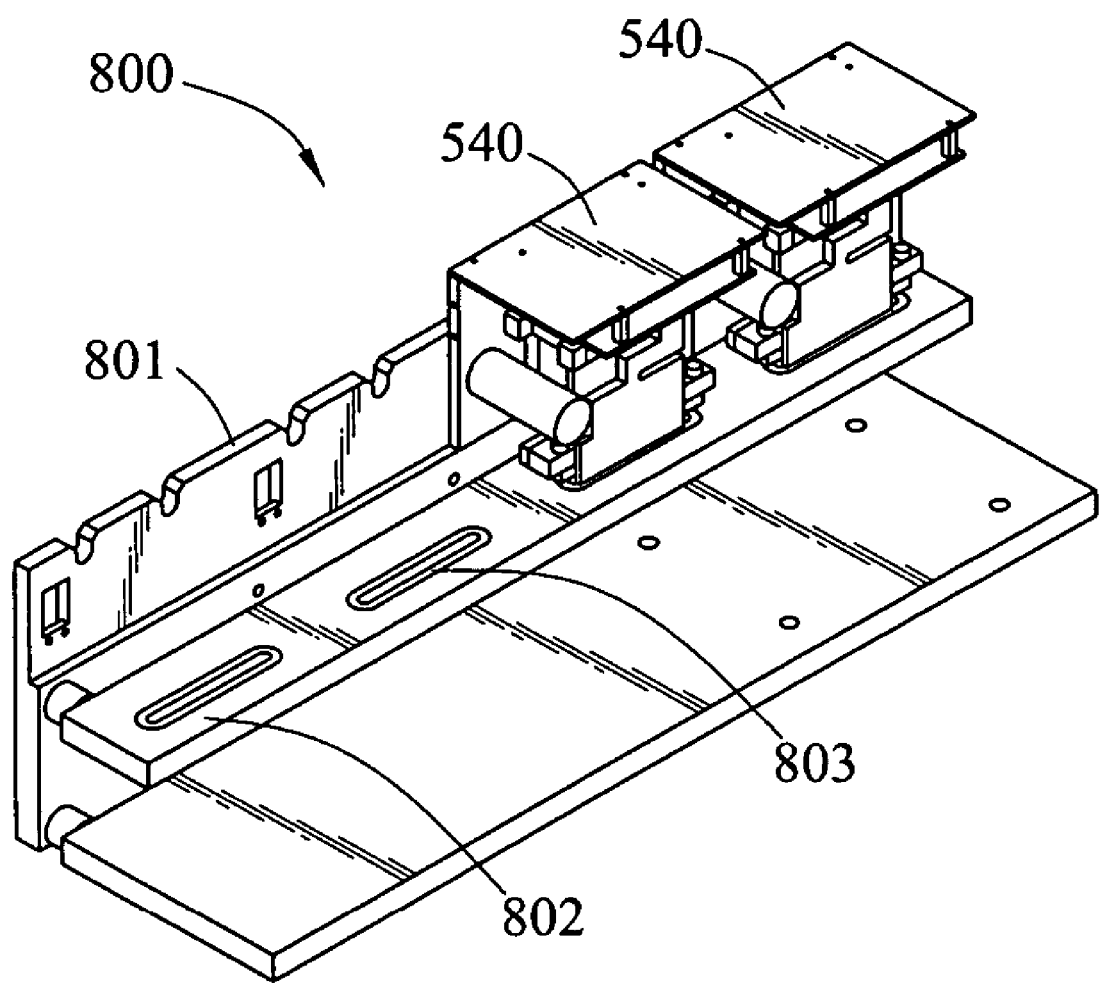
FIG. 7 is a schematic structural view of an injection head storage module depicted in FIG. 1.

Please refer to FIG. 7 of the injection head storage module 800. The injection head storage module 800 is used for displacing the injection head 541 and cleaning the injection head 541, when different injection head 541 are used. The injection head storage module 800 has a storage body 801, storage cover 802, and a storage cleaner 803, which can be taken out and placed easily. Another injection head module 540 to be used as a spare is placed on the injection head storage module 800.

Figure 8:
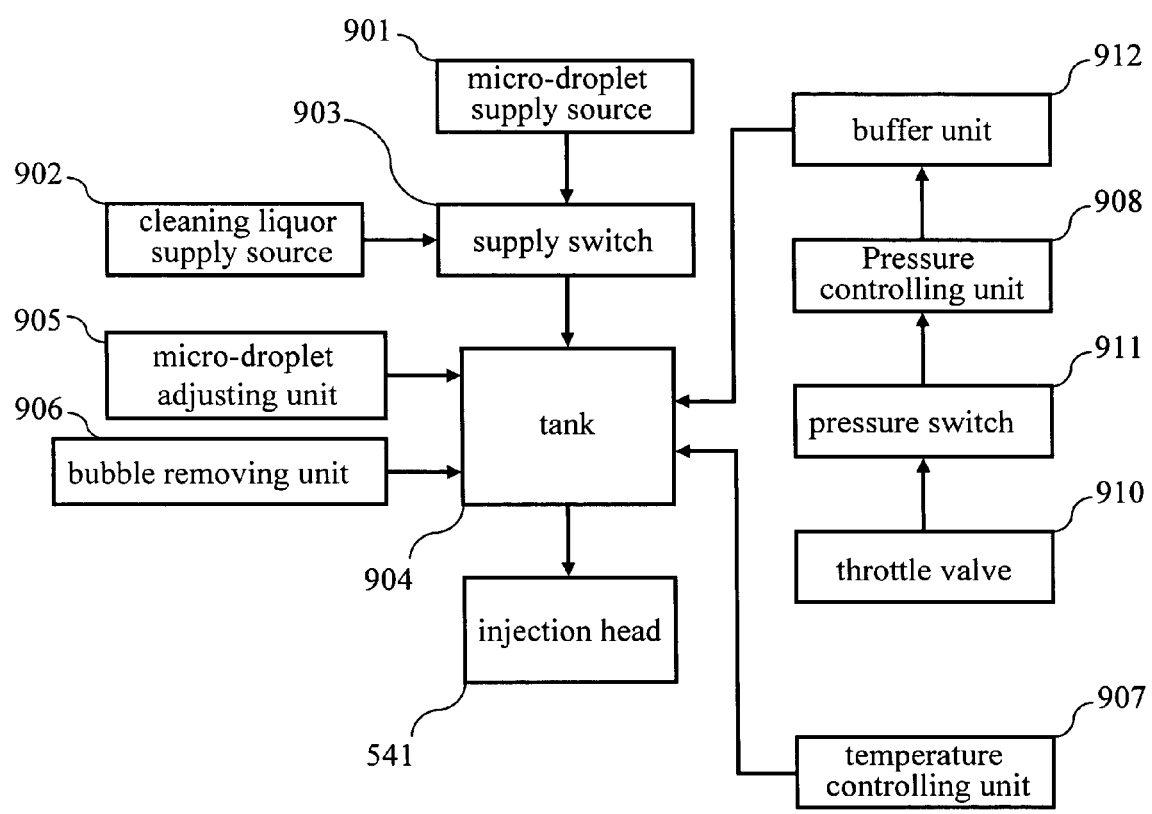
FIG. 8 is a flow chart of the supply of a supply module according to the embodiment of the present invention.

Please refer to FIG. 8 of the supply of a supply module 900, for controlling the supply of the micro-droplet, such that the micro-droplet to be injected by the injection head module 540 can satisfy process requirements with a suitable condition.

The supply module 900 includes a micro-droplet supply source 901 as a supply source for the injection, and a cleaning liquid supply source 902 for cleaning the injection head 541. Furthermore, depending on the working requirements of the injection head 541, the supply switch 903 can switch and control the supply of the micro-droplets and the cleaning liquid. A tank 904 is used to maintain a minute quantity of micro-droplets to be poured into the injection head 541, such that the supply module 900 can carry out accurate temperature and pressure control with regard to the micro-droplets in the tank 904. At the same time, the micro-droplet adjusting unit 905 is used to detect the micro-droplet volume in the tank 904. The bubble removing unit 906 is used to remove the bubbles flowing to the tank 904 from the micro-droplet supply source 901, to avoid a driving control problem for the injection head 541 when injecting. Moreover, the supply module 900 of the injection head 541 has a temperature controlling unit 907 and a pressure controlling unit 908, for controlling the temperature and pressure required for injecting the micro-droplets in the tank 904. The temperature controlling unit 907 can be used in cooperation with the temperature controlling module 450 of the moving stage module 400, to optimize the work condition between the substrate and the micro-droplet to be injected. The pressure controlling unit 908 outputs a positive or negative pressure by a throttle valve 910 with a back and forth motion and the output pressure is switched by a pressure switch 911. The pressure controlling unit 908 is connected to a buffer unit 912, to maintain stability at the required pressure by adjusting the pressure or the sectional area of the pipeline outlet.

Figure 13:
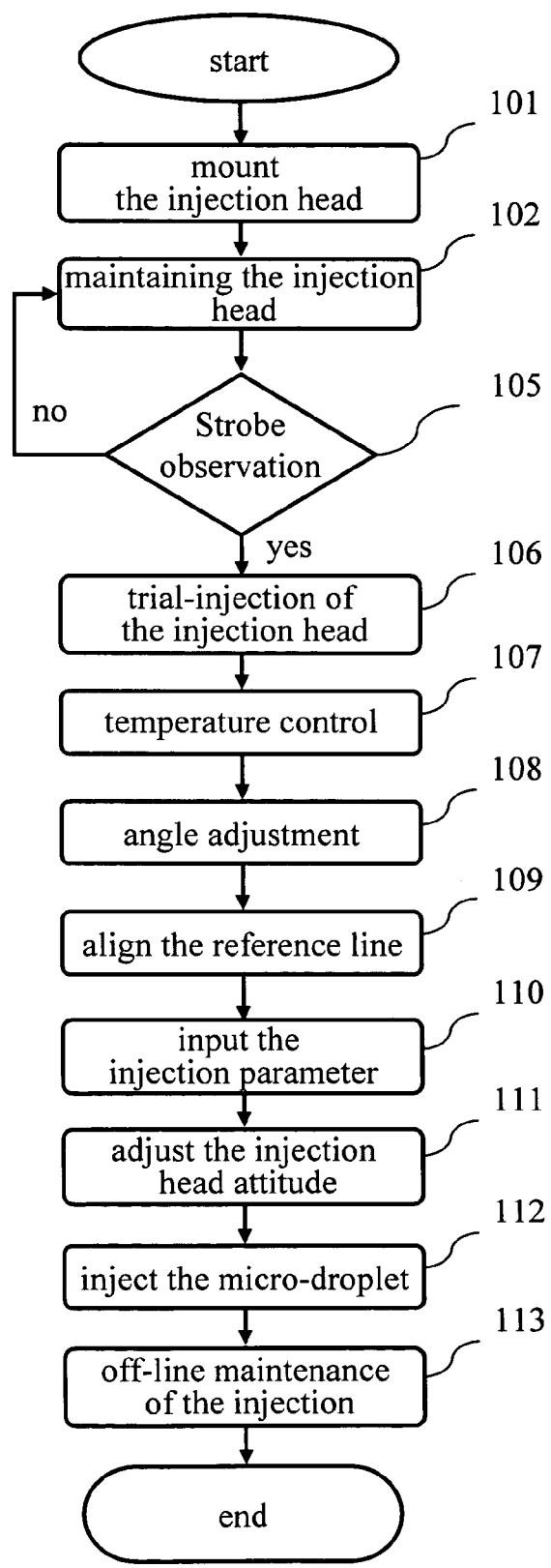
FIG. 13 is a flow chart according to the embodiment of the present invention.
Figure 14:
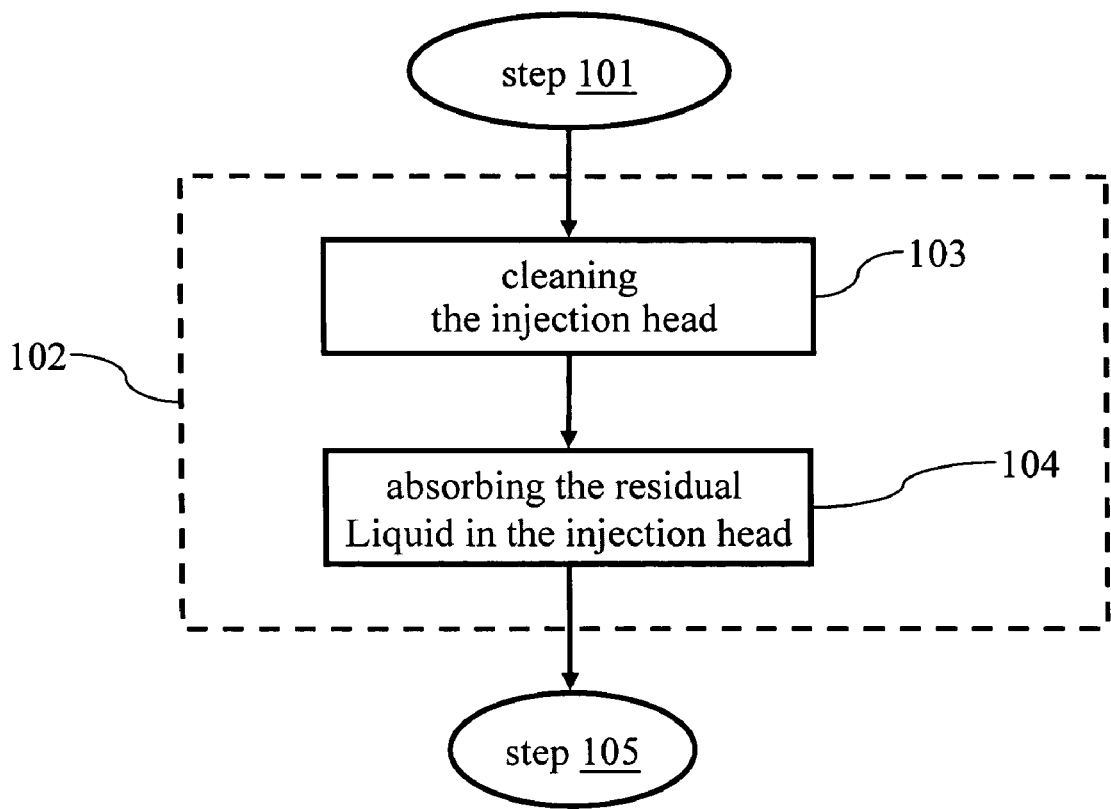
FIG. 14 is a schematic view of maintaining steps of the injection head according to the embodiment of the present invention.

Referring to FIGS. 13 and 14, micro-droplet injection apparatus is initialized at first, for example, mounting the injection head 541 (Step 101). Maintain the injection head 541 before it is operated (Step 102), i.e. cleaning the injection head 541 (Step 103). The injection head 541 is placed in the washing tank 711, which is filled with a solvent for cleaning the injection head 541, and then the injection head 541 is placed at the cap 712. The cap 712 can ensure the wetness of the injection head 541, and suck out the clog clogged in the injection head 541. The injection head 541 is moved to the absorbing module 720. Then, absorb micro-droplets or the solvent remaining in the jet orifices by contacting the porous body 721 of the absorbing module 720 with the injection head 541, the residual liquid (Step 104), to clean the injection head 541 thoroughly. If the length of the porous body 721 is not enough, the porous body 721 can be moved to continue the cleaning of the injection head 541 until cleaning has been completed.

Process a strobe observation by turning on the stroboscope 732 for detecting whether the state of the micro-droplets injected by the injection head 541 is normal or abnormal (Step 105). If there is something abnormal, the Step 102 is executed again. Optionally, the Step 103 and Step 104 also can be further executed. The signal course of the micro-droplets observed by the stroboscope 732 can be transmitted to a light-emitting diode for making a strobe frequency, to capture an instantaneous micro-droplet image. The size of the micro-droplets and the relative position and speed of the flight are recorded, and related information about each injection head injecting or not and the micro-droplets are integrated.

A preliminary position of the substrate carried out by the image detection module 600, that is, the injection area of the substrate is preliminarily located under the jet orifices 542 of the injection head module 540. A trial-injection of the injection head is carried out (Step 106). A reference jet orifice is moved onto a positioning area of the substrate, and then trial-injection is carried out, to adjust the relative position of the injection head 541. After the trial-injection, the positioning area is detected by the image detection module 600 until adjustment has been completed.

A temperature control is started by the temperature controlling module 450 (Step 107). The surface temperature of the substrate carried on the moving stage module 400 can be regulated and controlled. According to substrate process requirements, the heating element 441 and the cooling module 443 are selectively modulated with each other. Also, the micro-droplet can be solidified into a thin film successfully, after the substrate is injected.

The Φ rotating module 422 on the moving stage module 400 can adjust the stage module 430 in a small angle, and also can adjust the inclined angle of the carried substrate. The injection head 541 also has the harmonic driver 522 for completing the angle adjustment (Step 108). Thereby, the substrate can achieve alignment parallel with the X-Y axis by rotating the Φ axis. The substrate state is detected by the image detection device 601 of the image detection module 600, to identify the injection area for aligning the reference line (Step 109).

An injection parameter is input at the computer control terminal (Step 110), and the attitude adjusting module 530 is operated. The inclined angle of the injection head 541 can be adjusted by the attitude adjustment of the injection head 541 (Step 111), such that the injection head 541 and the substrate surface are in a parallel alignment, to ensure parallelism between the injection head 541 and the substrate surface. The distance between the injection head 541 and the substrate can be adjusted, preventing that the injection head 541 is damaged because of a too-short distance, or the micro-droplet cannot get a proper place on the substrate with one stroke because of a too-long distance.

After confirming the correction, the injection head 541 starts to inject the micro-droplets (Step 112), and the micro-droplet is directly injected on the substrate. An off-line maintenance of the injection head 541 is carried out (Step 113) after the injection is completed, for facilitating the next ink-injection. When another micro-droplet is changed to continue micro-droplet injection, the injection head 541 can be moved to the injection head storage module 800 and placed in the storage cleaning liquid 803 or another micro-droplet to be injected from the storage body 801 is taken out for displacement.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A micro-droplet injection apparatus, comprising:
an injection module, including an injection head with a plurality of jet orifices, for injecting a micro-droplet on a substrate, and an attitude adjusting module, for adjusting a parallelism and a distance between the injection head and the substrate;
a moving stage module, for carrying the substrate, such that the substrate moves relative to the injection head, wherein the moving stage module has an X-Y axis moving device for controlling the movement of the substrate, and a rotating module on the X-Y axis moving device for controlling the rotation of the substrate;
an image detection module, for detecting a relative position between the injection module and the substrate and the injection state of the injection module; and
a temperature controlling module, disposed on the moving stage module, for controlling the substrate surface temperature, the temperature controlling module including:

a plate layer;
a cooling layer, with one side contacting the plate layer;
a heat insulation layer, with one side contacting the other side of the cooling layer;
a temperature controlling layer, with a heating element for heating the temperature controlling layer, wherein one side of the temperature controlling layer is in contact with the other side of the heat insulation layer;
a clamping layer, contacted with the other side of the temperature controlling layer, for clamping the substrate;
a cooling module, selectively connected with the temperature controlling layer and the cooling layer; and
a cooling switcher, for switching the cooling module connected with the cooling layer, such that the moving stage module is in a heating state, or switching the cooling module connected with the temperature controlling layer, such that the moving stage module is in a cooling state.

2. The micro-droplet injection apparatus as claimed in claim 1, wherein the attitude adjusting module detects parallelism by a laser displacement gauge.

3. The micro-droplet injection apparatus as claimed in claim 1, wherein the image detection module comprises an image detection device, and image detection device is a charge coupled device or a complementary metal-oxide semiconductor sensing element.

4. The micro-droplet injection apparatus as claimed in claim 1, wherein the temperature controlling module further comprises a heating switcher, wherein when the moving stage module is in a heating state, the heating switcher enables the heating element for heating, or when the moving stage module is in a cooling state, the heating switcher disables the heating element to stop heating.

5. The micro-droplet injection apparatus as claimed in claim 1, wherein the clamping layer clamps the substrate by vacuum suction force, such that the substrate is clamped on the clamping layer.

6. The micro-droplet injection apparatus as claimed in claim 1, further comprising an injection head storage module, for displacing the injection head and cleaning the injection head.

7. The micro-droplet injection apparatus as claimed in claim 1, wherein the injection module has a supply module, which comprises a pressure controlling unit and a temperature controlling unit for controlling the pressure and temperature required for injecting the micro-droplet.

8. A micro-droplet injection apparatus, comprising:
an injection module, including an injection head with a plurality of jet orifices, for injecting a micro-droplet on a substrate, and an attitude adjusting module, for adjusting a parallelism and a distance between the injection head and the substrate;
a moving stage module, for carrying the substrate, such that the substrate moves relative to the injection head, wherein the moving stage module has an X-Y axis moving device for controlling the movement of the substrate, and a rotating module on the X-Y axis moving device for controlling the rotation of the substrate;
an image detection module, for detecting a relative position between the injection module and the substrate and the injection state of the injection module; and
a temperature controlling module, disposed on the moving stage module, for controlling the substrate surface temperature, the temperature controlling module including:
a plate layer;
a cooling layer, with one side contacting the plate layer;
a heat insulation layer, with one side contacting the other side of the cooling layer;
a temperature controlling layer, with a heating element for heating the temperature controlling layer, wherein one side of the temperature controlling layer is in contact with the other side of the heat insulation layer;
a clamping layer, contacted with the other side of the temperature controlling layer, for clamping the substrate;
a cooling module, selectively connected with the temperature controlling layer and the cooling layer; and
a cooling switcher, for switching the cooling module connected with the cooling layer, such that the moving stage module is in a heating state, or switching the cooling module connected with the temperature controlling layer, such that the moving stage module is in a cooling state,
wherein the temperature controlling module further comprises a heating switcher, wherein when the moving stage module is in a heating state, the heating switcher enables the heating element for heating, or when the moving stage module is in a cooling state, the heating switcher disables the heating element to stop heating.

9. A micro-droplet injection apparatus, comprising:
an injection module, including an injection head with a plurality of jet orifices, for injecting a micro-droplet on a substrate, and an attitude adjusting module, for adjusting a parallelism and a distance between the injection head and the substrate;
a moving stage module, for carrying the substrate, such that the substrate moves relative to the injection head, wherein the moving stage module has an X-Y axis moving device for controlling the movement of the substrate, and a rotating module on the X-Y axis moving device for controlling the rotation of the substrate;
an image detection module, for detecting a relative position between the injection module and the substrate and the injection state of the injection module; and
a temperature controlling module, disposed on the moving stage module, for controlling the substrate surface temperature, the temperature controlling module including:
a plate layer;
a cooling layer, with one side contacting the plate layer;
a heat insulation layer, with one side contacting the other side of the cooling layer;
a temperature controlling layer, with a heating element for heating the temperature controlling layer, wherein one side of the temperature controlling layer is in contact with the other side of the heat insulation layer;
a clamping layer, contacted with the other side of the temperature controlling layer, for clamping the substrate;
a cooling module, selectively connected with the temperature controlling layer and the cooling layer; and
a cooling switcher, for switching the cooling module connected with the cooling layer, such that the moving stage module is in a heating state, or switching the cooling module connected with the temperature controlling layer, such that the moving stage module is in a cooling state,
wherein the clamping layer clamps the substrate by vacuum suction force, such that the substrate is clamped on the clamping layer.

* * * * *